(12) United States Patent
Yamada

(10) Patent No.: US 10,706,912 B2
(45) Date of Patent: Jul. 7, 2020

(54) MEMORIES CONFIGURED TO CONTROL DISCHARGE OF A CONTROL GATE VOLTAGE OF A TRANSISTOR CONNECTED BETWEEN A DATA LINE AND A COMMON SOURCE

(71) Applicant: MICRON TECHNOLOGY, INC., Boise, ID (US)

(72) Inventor: Shigekazu Yamada, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/710,006

(22) Filed: Dec. 11, 2019

(65) Prior Publication Data
US 2020/0118615 A1    Apr. 16, 2020

Related U.S. Application Data

(63) Continuation of application No. 16/430,896, filed on Jun. 4, 2019, now Pat. No. 10,510,397, which is a continuation of application No. 15/866,982, filed on Jan. 10, 2018, now Pat. No. 10,347,320.
(Continued)

(51) Int. Cl.
| | |
|---|---|
| *G11C 16/14* | (2006.01) |
| *G11C 11/4091* | (2006.01) |
| *G11C 7/10* | (2006.01) |
| *G11C 7/18* | (2006.01) |
| *G11C 7/08* | (2006.01) |

(Continued)

(52) U.S. Cl.
CPC .......... *G11C 11/4091* (2013.01); *G11C 7/065* (2013.01); *G11C 7/08* (2013.01); *G11C 7/1048* (2013.01); *G11C 7/12* (2013.01); *G11C 7/18* (2013.01); *G11C 7/22* (2013.01); *G11C 11/1675* (2013.01); *G11C 11/4094* (2013.01); *G11C 16/14* (2013.01); *G11C 16/16* (2013.01); *G11C 16/24* (2013.01); *G11C 16/26* (2013.01);
(Continued)

(58) Field of Classification Search
CPC ............................... G11C 16/24; G11C 16/14
See application file for complete search history.

(56) References Cited

U.S. PATENT DOCUMENTS

| | | |
|---|---|---|
| 5,115,146 A | 5/1992 | McClure |
| 5,942,925 A | 8/1999 | Stahl |

(Continued)

*Primary Examiner* — Amir Zarabian
*Assistant Examiner* — Jay W. Radke
(74) *Attorney, Agent, or Firm* — Dicke, Billig & Czaja, PLLC

(57) ABSTRACT

Memory might include control logic configured to apply an erase pulse to a data line and to a common source concurrently with applying a higher second voltage level to a control gate of a transistor connected between the data line and the common source, concurrently discharge the voltage level of the data line and the voltage level of the common source, monitor a representation of a voltage difference between the voltage level of the data line and the voltage level of the control gate of the transistor, activate a current path between the control gate of the transistor and the common source in response to the voltage difference being deemed to be greater than a first value, and deactivate the current path between the control gate of the transistor and the common source in response to the voltage difference being deemed to be less than a second value.

20 Claims, 8 Drawing Sheets

Related U.S. Application Data

(60) Provisional application No. 62/610,972, filed on Dec. 28, 2017.

(51) Int. Cl.
   *G11C 7/12*     (2006.01)
   *G11C 7/22*     (2006.01)
   *G11C 11/4094*  (2006.01)
   *G11C 11/16*    (2006.01)
   *G11C 7/06*     (2006.01)
   *G11C 16/28*    (2006.01)
   *G11C 16/16*    (2006.01)
   *G11C 16/32*    (2006.01)
   *G11C 16/26*    (2006.01)
   *G11C 16/24*    (2006.01)

(52) U.S. Cl.
   CPC .............. *G11C 16/28* (2013.01); *G11C 16/32* (2013.01); *G11C 2207/002* (2013.01)

(56) References Cited

U.S. PATENT DOCUMENTS

| | | |
|---|---|---|
| 6,028,788 A | 2/2000 | Choi et al. |
| 6,333,670 B1 | 12/2001 | Kono et al. |
| 6,903,583 B1 | 6/2005 | Habib et al. |
| 8,270,224 B2 | 9/2012 | Macerola |
| 8,724,391 B2 | 5/2014 | Nakamura et al. |
| 9,711,228 B1 | 7/2017 | Tanzawa |
| 10,347,320 B1 * | 7/2019 | Yamada ................... G11C 7/12 |
| 10,510,397 B2 * | 12/2019 | Yamada .............. G11C 11/4091 |

* cited by examiner

MEMORIES CONFIGURED TO CONTROL DISCHARGE OF A CONTROL GATE VOLTAGE OF A TRANSISTOR CONNECTED BETWEEN A DATA LINE AND A COMMON SOURCE

RELATED APPLICATIONS

This application is a Continuation of U.S. patent application Ser. No. 16/430,896, filed Jun. 4, 2019, titled "INTEGRATED CIRCUIT DEVICES CONFIGURED TO CONTROL DISCHARGE OF A CONTROL GATE VOLTAGE," which is a Continuation of U.S. patent application Ser. No. 15/866,982, filed Jan. 10, 2018, titled "CONTROLLING DISCHARGE OF A CONTROL GATE VOLTAGE," issued as U.S. Pat. No. 10,347,320 on Jul. 9, 2019 and claims the benefit of U.S. Provisional Patent Application Ser. No. 62/610,972, filed Dec. 28, 2017 and titled, "CONTROLLING DISCHARGE OF A CONTROL GATE VOLTAGE," which are commonly assigned and incorporated by reference herein in their entirety.

TECHNICAL FIELD

The present disclosure relates generally to memory and, in particular, in one or more embodiments, the present disclosure relates to methods of operating memory for controlling discharge of a control gate voltage, e.g., during or following an erase operation.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of data storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). An MLC uses more than two Vt ranges, where each Vt range indicates a different data state. Multiple-level cells can take advantage of the analog nature of a traditional charge storage cell by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In erasing memory, memory cells might be erased by grounding access lines of a block of memory cells while applying a relatively high erase voltage (e.g., about 20V or more) to a source and data lines of the block of memory cells, and thus to the channels of those memory cells, to remove charge from their data storage structures. Although voltage levels of an erase operation may be well controlled as voltages are applied, their discharge may be less controlled.

DETAILED DESCRIPTION

Figure 1:
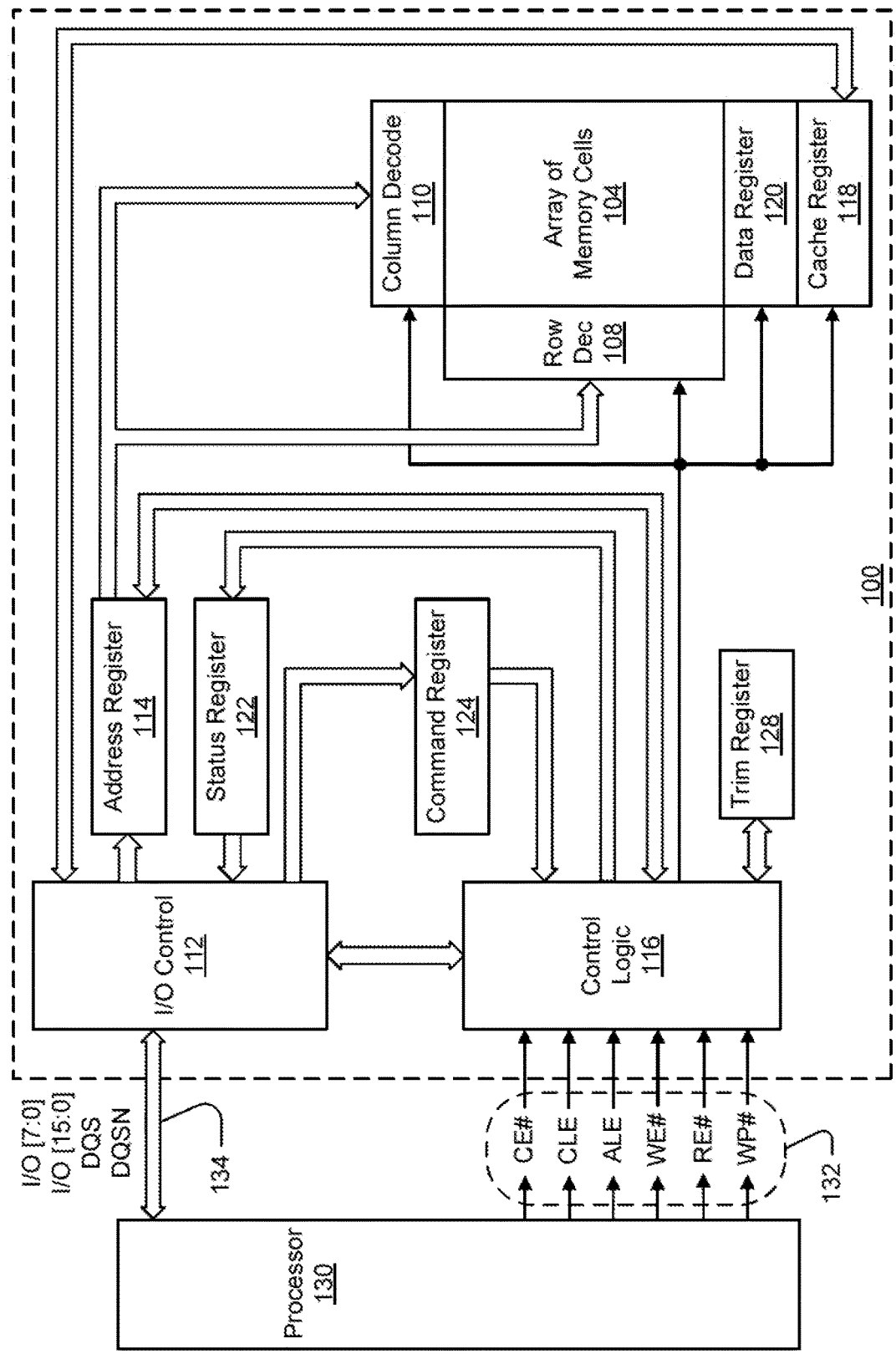
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

FIG. 1 is a simplified block diagram of a first apparatus (e.g., an integrated circuit device), in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A trim register 128 may be in communication with the control logic 116 to store trim settings. Although depicted as a separate storage register, trim register 128 may represent a portion of the array of memory cells 104. Trim settings are generally values used by an integrated circuit device to define values of voltage levels, control signals, timing parameters, quantities, options, etc. to be used during operation of that integrated circuit device.

A controller (e.g., the control logic 116 internal to the memory device 100) controls access to the array of memory cells 104 in response to the commands and generates status information for the external processor 130, i.e., control logic 116 is configured to perform access operations (e.g., read operations, program operations and/or erase operations) and other operations in accordance with embodiments described herein. The control logic 116 is in communication with row decode circuitry 108 and column decode circuitry 110 to control the row decode circuitry 108 and column decode circuitry 110 in response to the addresses.

Control logic 116 may also be in communication with a cache register 118. Cache register 118 may latch data, either incoming or outgoing, as directed by control logic 116 to temporarily store data while the array of memory cells 104 is busy writing or reading, respectively, other data. During a program operation (e.g., write operation), data may be passed from the cache register 118 to data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown) to sense a data state of a memory cell of the array of memory cells 104. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may be written into command register 124. The addresses may be received over input/output (I/O) pins [7:0] of I/O bus 134 at I/O control circuitry 112 and may be written into address register 114. The data may be received over input/output (I/O) pins [7:0] for an 8-bit device or input/output (I/O) pins [15:0] for a 16-bit device at I/O control circuitry 112 and may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. The I/O bus 134 might further include complementary data strobes DQS and DQSN that may provide a synchronous reference for data input and output. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
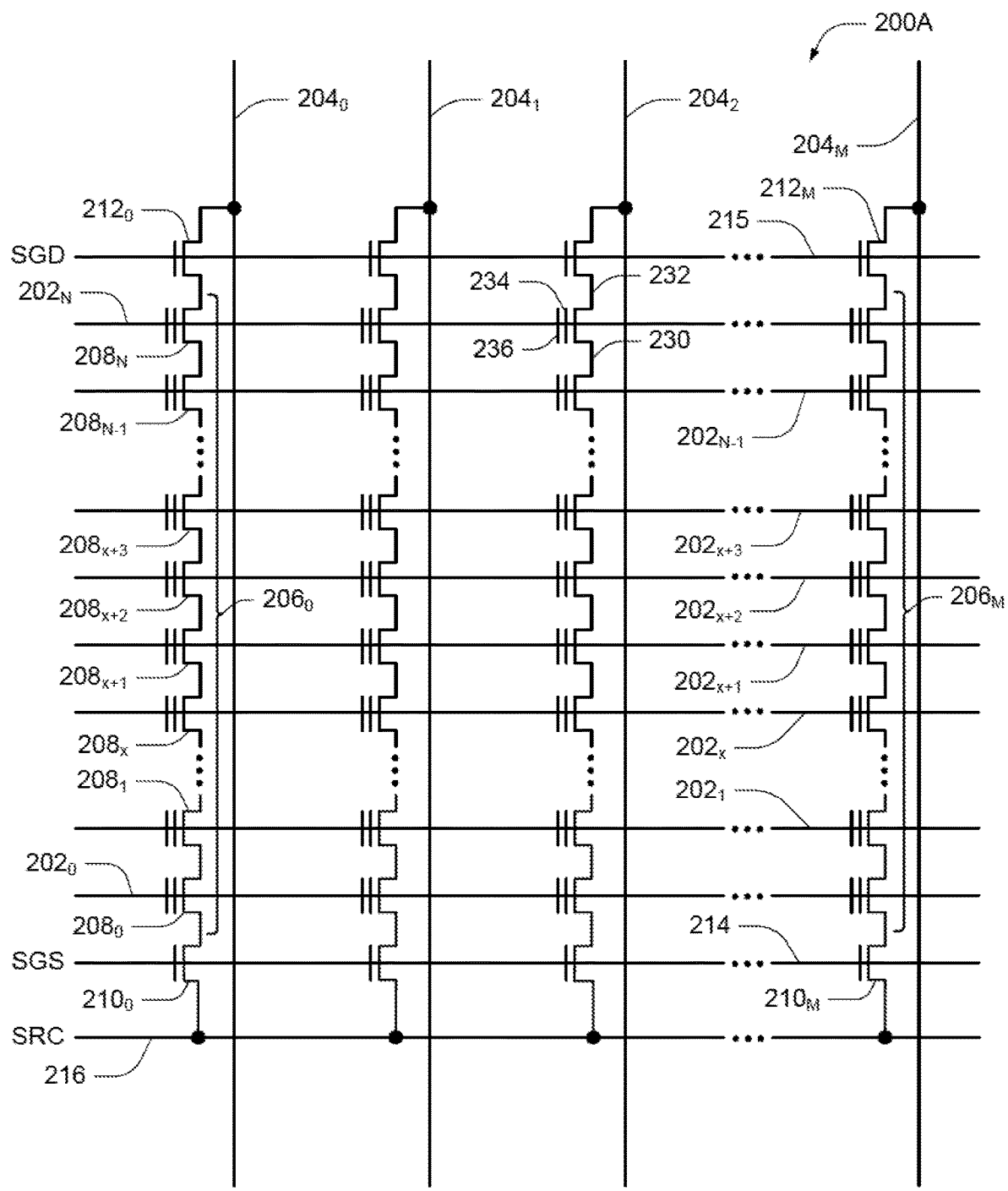
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
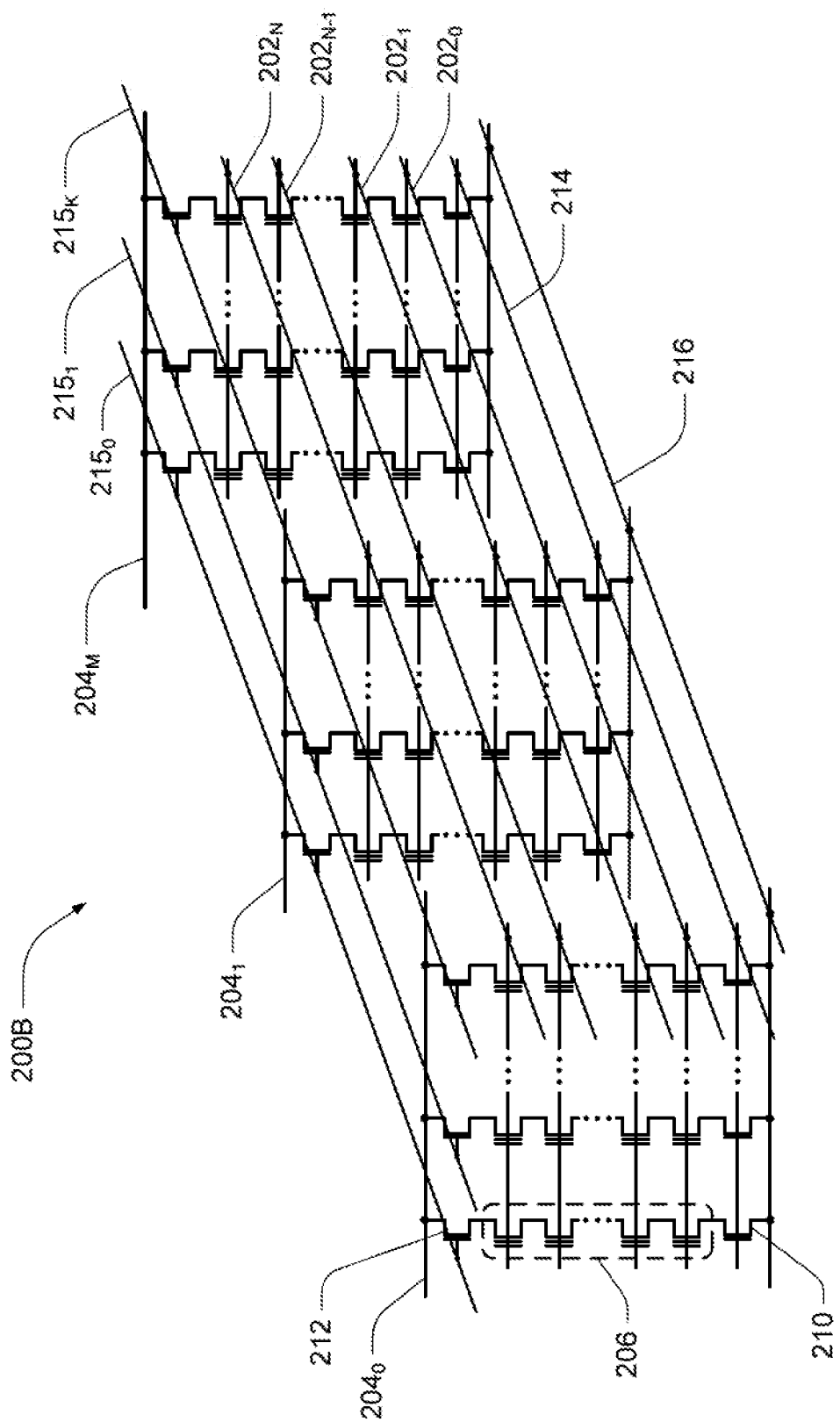

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3:
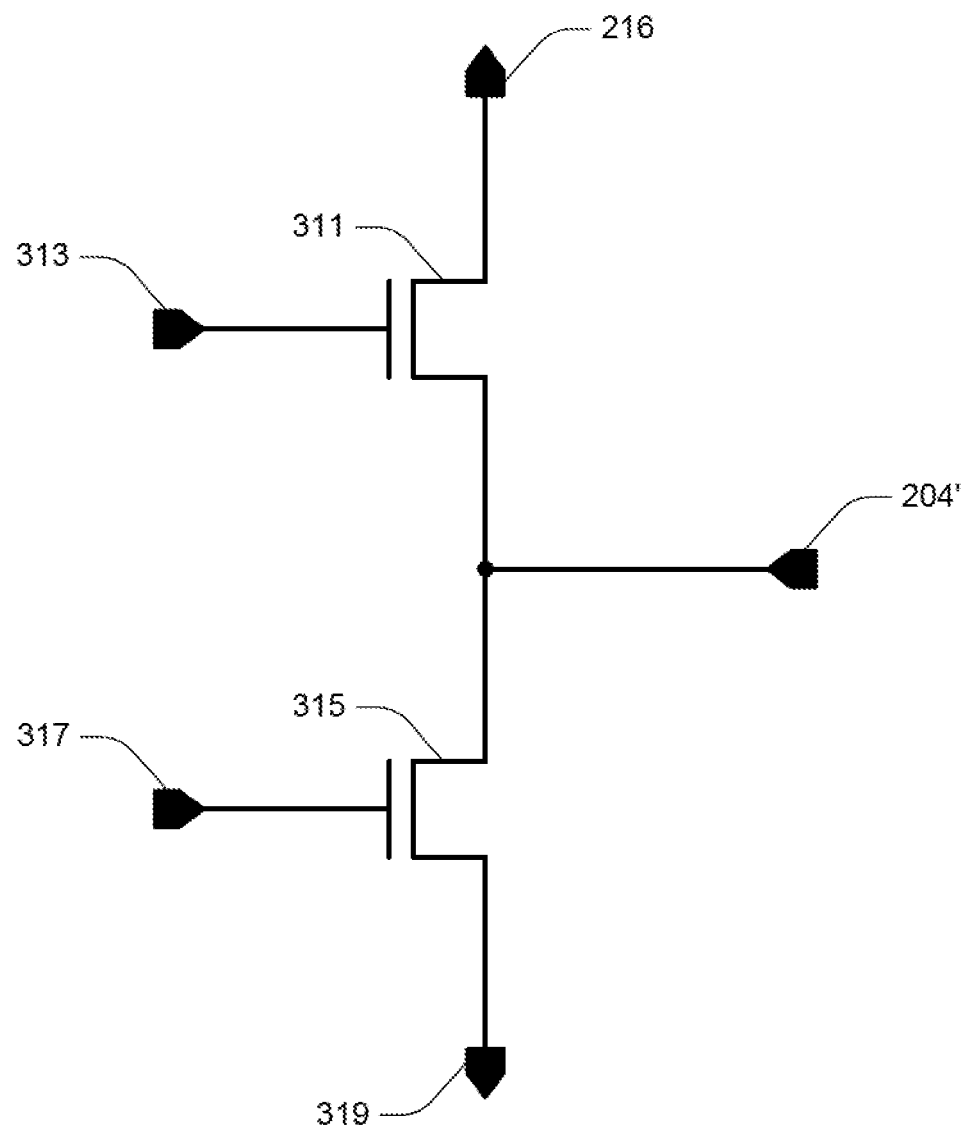
FIG. 3 is a schematic illustrating circuitry for selective connection of a data line, for an array of memory cells as could be used in a memory of the type described with reference to FIG. 1, to a source or other circuitry of the memory.

FIG. 3 is a schematic illustrating circuitry for selective connection of a data line, for an array of memory cells as could be used in a memory of the type described with reference to FIG. 1, to a source or other circuitry of the memory. In particular, FIG. 3 depicts the selective connection of a data line 204' to a source (e.g., common source) 216 through a transistor (e.g., an n-type field-effect transistor or nFET) 311, and the selective connection of the data line 204' to a node 319 through a transistor (e.g., an nFET) 315. The node 319 might provide connection to peripheral circuitry of an array of memory cells. For example, the node 319 might provide connection to a page buffer, e.g., the cache register 118 and/or data register 120 of FIG. 1. The data line 204' might represent any data line 204 of FIG. 2A or 2B, while the source 216 might represent the source 216 of FIG. 2A or 2B, for example.

The transistor 311 might selectively connect the data line 204' to the source 26 in response to a control signal from control signal node 313 applied to the control gate of the transistor 311. The control signal node 313 may be connected to a control gate for each of a number of transistors 311 connected between other data lines 204 and the source 216. The data line 204' might be connected to the source 216 during an erase operation, while being isolated from the node 319. The transistor 315 might selectively connect the data line 204' to the node 319 in response to a control signal from control signal node 317 applied to the control gate of the transistor 315. The data line 204' might be connected to the node 319 during a read operation or a programming operation, while being isolated from the source 216.

Typically, an erase operation includes a series of erase pulses applied to the NAND strings 206 through their respective data lines 204 and source 216 while voltage levels are applied to the access lines 202 sufficient to activate the corresponding memory cells. An erase verify operation may be performed between pulses to determine if the memory cells have been sufficiently erased (e.g., have threshold voltages at or below some target value). If the erase verify is failed, another erase pulse, typically having a higher voltage level, may be applied. For each pulse, the transistor 311 might be activated in response to a ramped voltage signal on the control signal node 313, e.g., a ramp from 0V to the voltage level above the voltage level the erase pulse (e.g., 24V), while a voltage of the source 216 and the data line 204' are concurrently ramped up, e.g., a ramp from 0V to the voltage level of the erase pulse (e.g., 20V) for this example. As used herein, a first act and a second act occur concurrently when the first act occurs simultaneously with the second act for at least a portion of a duration of the second act. For example, for at least a portion of ramping up the voltage level of the data line and the source, the voltage level of the control gate of the transistor 311 is being simultaneously ramped up.

Ramping of such voltages can be generally well controlled by voltage generation devices (not shown) of a memory device. Following the erase pulse, these voltages are generally discharged to prepare for an erase verify or other subsequent access operation. The voltage level on the control signal node 313 might be allowed to electrically float while the voltage level of the data line 204' is discharged, with an expectation that the voltage level of the control signal node 313 might follow the voltage level of the data line 204' due to gate-drain coupling. For example, the control signal node 313 might be electrically isolated from any voltage supply, such that voltage discharge may be the result of capacitive coupling between the control signal node 313 and the data line 204'. However, depending upon the degree of coupling and other factors, variations beyond desired operating conditions might develop. For example, the voltage level of the control signal node 313 may discharge too slowly, and a voltage difference across the transistor 311 might exceed a breakdown voltage of that device. Various embodiments seek to mitigate such variations by providing control of the discharge of the control signal node 313, e.g., the voltage level to the control gate of the transistor 311.

Figure 4:
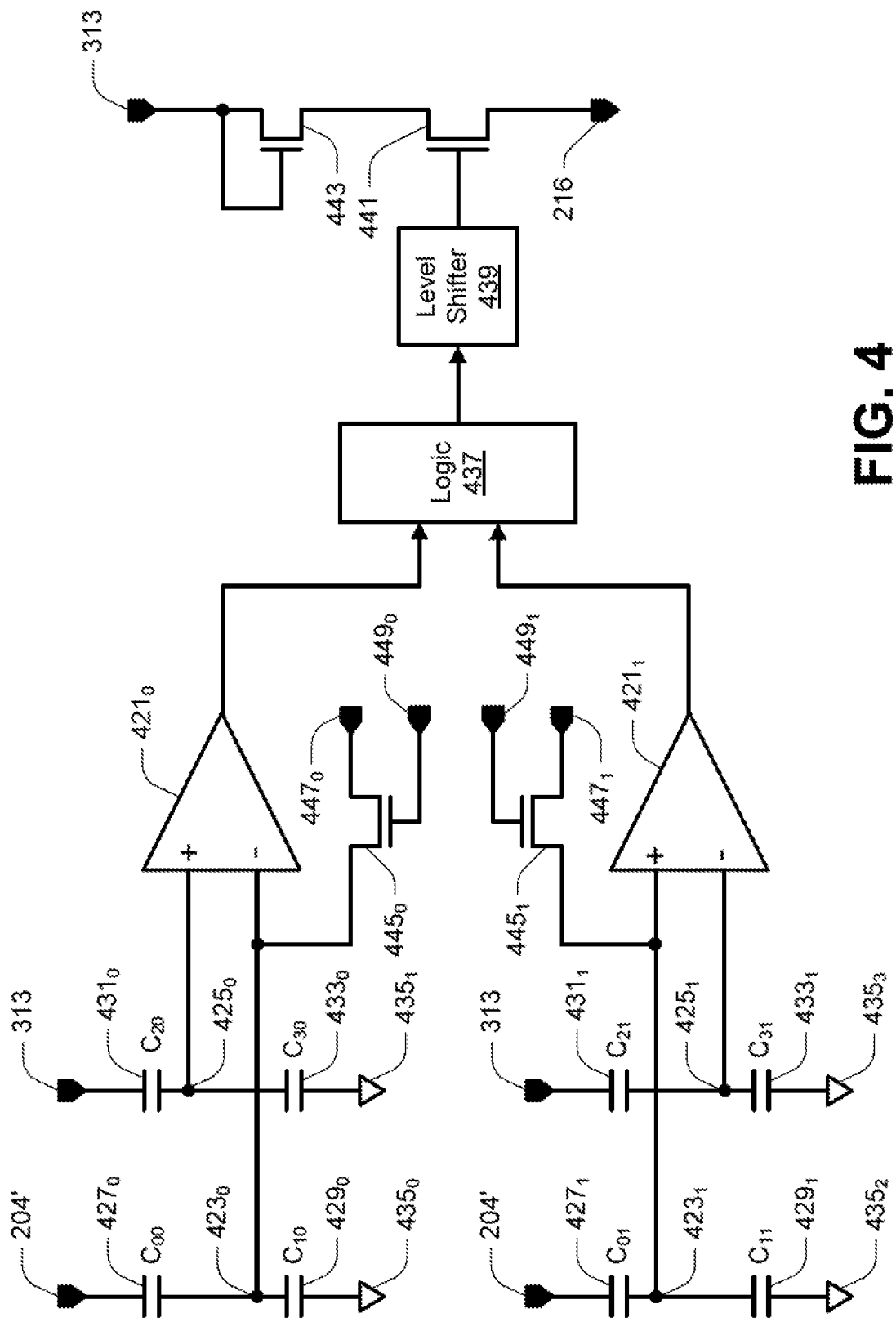
FIG. 4 is a block schematic of circuitry for selectively controlling discharge of a control gate voltage in accordance with an embodiment.

FIG. 4 is a block schematic of circuitry for selectively controlling discharge of a control gate voltage in accordance with an embodiment. The circuitry of FIG. 4 might include a comparator (e.g., a differential amplifier) $421_0$ having a first input (e.g., an inverting or "−" input) connected to a voltage node $423_0$. The voltage node $423_0$ may be capacitively coupled to the data line 204' through a capacitance (e.g., capacitor) $427_0$. The capacitance $427_0$ may be connected (e.g., selectively connected) to the data line 204'. The capacitance $427_0$ may represent one or more capacitors connected in parallel and/or series to provide a particular capacitance value $C_{00}$. The voltage node $423_0$ may be further capacitively coupled to a reference node $435_0$ through a capacitance (e.g., capacitor) $429_0$. The reference node $435_0$ might be coupled to receive a reference potential, such as a ground potential Vss or 0V. The capacitance $429_0$ may represent one or more capacitors connected in parallel and/or series to provide a particular capacitance $C_{10}$. The sizing and ratio of the capacitance values $C_{00}$ and $C_{10}$ might be chosen to divide the voltage level of the data line 204' down to a value (e.g., expected range of values) at the voltage node $423_0$ that is suitable for operation of the comparator $421_0$.

The voltage node $423_0$ may further be selectively connected to a voltage node $447_0$ through a transistor (e.g., an nFET) $445_0$ responsive to a control signal from control signal node $449_0$ connected to the control gate of the transistor $445_0$. The voltage node $447_0$ may be configured to receive a reference voltage Vrefinit0 that might represent a first threshold, e.g., a high limit. Use and determination of the reference voltage Vrefinit0 will be described infra.

The comparator $421_0$ might have a second input (e.g., a non-inverting or "+" input) connected to a voltage node $425_0$. The comparator $421_0$ may be configured to provide a first logic level, e.g., a logic high level, if the voltage level at its second input is less than the voltage level at its first input, and a second logic level, e.g., a logic low level, if the voltage level at its second input is greater than the voltage level at its first input. The voltage node $425_0$ may be capacitively coupled to the control signal node 313, and thus to a voltage level of the control gate of the transistor connected between the data line 204' and the source 216, through a capacitance (e.g., capacitor) $431_0$. The capacitance $431_0$ may be connected (e.g., selectively connected) to the control signal node. The capacitance $431_0$ may represent one or more capacitors connected in parallel and/or series to provide a particular capacitance value $C_{20}$. The voltage node $425_0$ may be further capacitively coupled to a reference node $435_1$ through a capacitance (e.g., capacitor) $433_0$. The reference node $435_1$ might be coupled to receive a reference potential, such as a ground potential Vss or 0V. The reference node $435_1$ may be a same voltage node as the reference node $435_0$. The capacitance $433_0$ may represent one or more capacitors connected in parallel and/or series to provide a particular capacitance $C_{30}$. The sizing and ratio of the capacitance values $C_{20}$ and $C_{30}$ might be chosen to divide the voltage level of the control signal node 313 down to a value (e.g., expected range of values) at the voltage node $425_0$ that is suitable for operation of the comparator $421_0$. The sizing and ratio of the capacitance values $C_{20}$ and $C_{30}$ might be chosen to be substantially equal (e.g., equal) to the sizing and ratio of the capacitance values $C_{00}$ and $C_{10}$, respectively. The phrase "substantially equal" as used herein recognizes that even where values may be intended to be equal, variabilities and accuracies of industrial processing may lead to differences from their intended values. These variabilities and accuracies will generally be dependent upon the technology utilized in fabrication of the integrated circuit device.

The circuitry of FIG. 4 might further include a comparator (e.g., a differential amplifier) $421_1$ having a first input (e.g., an inverting or "−" input) connected to a voltage node $425_1$. The voltage node $425_1$ may be capacitively coupled to the control signal node 313, and thus to a voltage level of the control gate of the transistor connected between the data line 204' and the source 216, through a capacitance (e.g., capacitor) $431_1$. The capacitance $431_1$ may be connected (e.g., selectively connected) to the control signal node 313. The capacitance $431_1$ may represent one or more capacitors connected in parallel and/or series to provide a particular capacitance value $C_{21}$. The voltage node $425_1$ may be further capacitively coupled to a reference node $435_3$ through a capacitance (e.g., capacitor) $433_1$. The reference node $435_3$ might be coupled to receive a reference potential, such as a ground potential Vss or 0V. The capacitance $433_1$ may represent one or more capacitors connected in parallel and/or series to provide a particular capacitance $C_{31}$. The sizing and ratio of the capacitance values $C_{21}$ and $C_{31}$ might be chosen to divide the voltage level of the control signal node 313 down to a value (e.g., expected range of values) at the voltage node $425_1$ that is suitable for operation of the comparator $421_1$.

The comparator $421_1$ might have a second input (e.g., a non-inverting or "+" input) connected to a voltage node $423_1$. The comparator $421_1$ may be configured to provide a first logic level, e.g., a logic high level, if the voltage level at its second input is less than the voltage level at its first input, and a second logic level, e.g., a logic low level, if the voltage level at its second input is greater than the voltage level at its first input. The voltage node $423_1$ may be capacitively coupled to the data line 204' through a capacitance (e.g., capacitor) $427_1$. The capacitance $427_1$ may be connected (e.g., selectively connected) to the data line 204'. The capacitance $427_1$ may represent one or more capacitors connected in parallel and/or series to provide a particular capacitance value $C_{01}$. The voltage node $423_1$ may be further capacitively coupled to a reference node $435_2$ through a capacitance (e.g., capacitor) $429_1$. The reference node $435_2$ might be coupled to receive a reference potential, such as a ground potential Vss or 0V. The reference node $435_2$ may be a same voltage node as the reference node $435_3$, and may further be a same voltage node as the reference nodes $435_0$ and $435_1$. The capacitance $429_1$ may represent one or more capacitors connected in parallel and/or series to provide a particular capacitance $C_{11}$. The sizing and ratio of the capacitance values $C_{01}$ and $C_{11}$ might be chosen to divide the voltage level of the data line 204' down to a value (e.g., expected range of values) at the voltage node $423_1$ that is suitable for operation of the comparator $421_1$. The sizing and ratio of the capacitance values $C_{01}$ and $C_{11}$ might be chosen to be substantially equal (e.g., equal) to the sizing and ratio of the capacitance values $C_{21}$ and $C_{31}$, respectively.

The voltage node $423_1$ may further be selectively connected to a voltage node $447_1$ through a transistor (e.g., an nFET) $445_1$ responsive to a control signal from control signal node $449_1$ connected to the control gate of the transistor $445_1$. The voltage node $447_1$ may be configured to receive a reference voltage Vrefinit1 that might represent a second threshold, e.g., a low limit. Use and determination of the reference voltage Vrefinit1 will be described infra. The control signal nodes $449_0$ and $449_1$ may be configured to receive a same control signal.

An output of the comparator $421_0$ and an output of the comparator $421_1$ may be connected to logic 437. The logic 437 may be any configuration of combinational and/or combinatorial logic to provide an output from logic 437 having a first logic level, e.g., a logic high level, if the comparator $421_0$ indicates that the voltage level of the voltage node $425_0$ is greater than the voltage level of the voltage node $423_0$, and to provide an output from logic 437 having a second logic level, e.g., a logic low level, if the comparator $421_1$ indicates that the voltage level of the voltage node $425_1$ is less than the voltage level of the voltage node $423_1$. Note that while the first and second logic levels of the comparators 421 were also described in example as corresponding to the logic high level and the logic low level, respectively, the correspondence of particular logic levels for the outputs of the comparators 421 and the logic 437 may be altered while achieving the same results.

The logic 437 might further be configured to maintain the logic level of its output if the comparator $421_0$ indicates that the voltage level of the voltage node $425_0$ is less than the voltage level of the voltage node $423_0$, and the comparator $421_1$ indicates that the voltage level of the voltage node $425_1$ is greater than the voltage level of the voltage node $423_1$. For example, if the logic level of the output of the logic 437 is the first logic level due to an output of the comparator $421_0$ indicating that the voltage level of the voltage node $425_0$ is greater than the voltage level of the voltage node $423_0$, and a logic level of the output of the comparator $421_0$ transitions, the logic 437 may maintain its output logic level at the first logic level until the comparator $421_1$ indicates that the voltage level of the voltage node $425_1$ is less than the voltage level of the voltage node $423_1$. Conversely, if the logic level of the output of the logic 437 is the second logic level due to an output of the comparator $421_1$ indicating that the voltage level of the voltage node $425_1$ is less than the voltage level of the voltage node $423_1$, and a logic level of the output of the comparator $421_1$ transitions, the logic 437 may maintain its output logic level at the second logic level until the comparator $421_0$ indicates that the voltage level of the voltage node $425_0$ is greater than the voltage level of the voltage node $423_0$. Table 1 might represent a truth table for logic 437 for such an embodiment.

TABLE 1

| Comparator $421_0$ Output | Comparator $421_1$ Output | Logic 437 Prior Output | Logic 437 Current Output |
|---|---|---|---|
| L | H | X | H |
| H | H | H | H |
| H | H | L | L |
| H | L | X | L |

L = logic low; H = logic high; X = do not care

The control signal node 313 may be selectively connected to the source 216 through a transistor (e.g., nFET) 441 responsive to the output of the logic 437. The voltage levels corresponding to one or more of the logic levels (e.g., the logic high level) of the output of the logic 437 may need to be transitioned to another voltage domain in order to provide an appropriate control gate voltage to control the transistor 441. Accordingly, a level shifter 439 may be included to transition the voltage levels of the logic 437 to an appropriate voltage domain. A diode-connected transistor (e.g., nFET) 443 may be included between the control signal node 313 and the transistor 441. The diode-connected transistor 443 might be used to mitigate a risk of discharging the control signal node 313 to a point where the control gate voltage of the transistor 311 falls below its threshold voltage Vt during discharge of the voltage levels of the data line 204' and the source 216.

Through selection of particular voltage levels of the reference voltages Vrefinit0 and Vrefinit1, the comparator $421_0$ can indicate whether the voltage level of the node $425_0$ indicates that the voltage level of the control signal node 313 is greater than an upper limit, e.g., some voltage level in excess of the voltage level of the data line 204' that is less than a break-down voltage of the transistor 311 of FIG. 3, while the comparator $421_1$ can indicate whether the voltage level of the node $425_1$ indicates that the voltage level of the control signal node 313 is less than a lower limit, e.g., some voltage level in excess of the voltage level of the data line 204' that is greater than a threshold voltage of the transistor 311 of FIG. 3.

To determine values of Vrefinit0 and Vrefinit1, the following equations may apply:

$$-(Vsrcinit-Vrefinit)*C1+Vrefinit*C2 = -(Vsrc-Vdet\_src)*C1+Vdet\_src*C2 \quad \text{Eq. 1}$$

$$Vdet\_src = (C1/(C1+C2))*(Vsrc-Vsrcinit)+Vrefinit \quad \text{Eq. 2}$$

$$Vdet\_src = Vdet\_hviso \quad \text{Eq. 3}$$

$$Vhviso-Vsrc = Vhvisoinit-Vsrcinit+((C1+C2)/C1)* (Vrefinit-Vrefhviso) \quad \text{Eq. 4}$$

Table 2 may provide definitions of the variables of the Equations 1-4. In Table 2, the voltage node 423 may correspond to the voltage node $423_0$ or $423_1$; the voltage node 425 may correspond to the voltage node $425_0$ or $425_1$, respectively; the reference node 435 may correspond to the reference node $435_0$ or $435_1$, respectively; Vrefinit may correspond to the reference voltage Vrefinit0 or Vrefinit1, respectively; C1 may correspond to the capacitance value $C_{00}$ or $C_{01}$, respectively; and C2 may correspond to the capacitance value $C_{10}$ or $C_{11}$, respectively.

TABLE 2

| Variable or Constant Name | Definition |
|---|---|
| Vsrcinit | Voltage level of the data line 204' prior to discharge |
| Vsrc | Voltage level of the data line 204' during discharge |
| Vrefinit | Voltage level of voltage node 423 prior to discharge of Vsrc |
| Vdet_src | Voltage level of voltage node 423 during discharge of the data line 204' |
| Vhvisoinit | Voltage level of control signal node 313 prior to discharge |
| Vhviso | Voltage level of the control signal node 313 during discharge |
| Vrefhviso | Voltage level of voltage node 425 prior to discharge of the control signal node 313 |
| Vdet_hviso | Voltage level of voltage node 425 during discharge of the control signal node 313 |
| C1 | Capacitance value of the capacitance between the data line 204' and the voltage node 423 |
| C2 | Capacitance value of the capacitance between the voltage node 423 and the reference node 435 |

With reference to Equations 1-4 and Table 2, Equation 1 describes a relationship between the voltage level of the data line 204' and the voltage level of the voltage node 423 prior to and during discharge of the voltage level of the data line 204'. Equation 2 simplifies the equality of Equation 1. Equation 3 represents a condition at which the comparator would transition under ideal conditions. Equation 4 then represents the resulting relationship between the voltage level of the data line 204' and the voltage level of the control signal node 313 prior to and during discharge of these voltage levels.

By selecting desired values for the quantity Vhviso−Vsrc, e.g., some value below a breakdown voltage of the transistor between the data line 204' and the source 216 and some value above a threshold voltage of that transistor, Vrefinit0 and Vrefinit1, respectively, might be calculated based on known values of C1, C2, Vhvisoinit, Vsrcinit and Vrefhviso. As an example, if the breakdown voltage of the transistor 311 of FIG. 3 is 4V, Vhviso−Vsrc might be set to equal 3V. For an erase operation where Vhvisoinit=24V and Vsrcinit=22V, and for a configuration having capacitance values such that (C1+C2)/C1=20 producing Vrefhviso=1.00V, Vrefinit might be calculated to equal 1.05V. Accordingly, the voltage node $447_0$ might be configured to receive a voltage level of 1.05V as Vrefinit0 to facilitate operation of the comparator $421_0$ to indicate whether the voltage level of the control signal node 313 is deemed to be greater than 3V above the voltage level of the data line 204'.

Continuing with this example, if the threshold voltage of the transistor 311 of FIG. 3 is 1.5V, Vhviso−Vsrc might be set to equal 2V, and Vrefinit might be calculated to equal 1.00V. Accordingly, the voltage node $447_1$ might be configured to receive a voltage level of 1.00V as Vrefinit1 to facilitate operation of the comparator $421_1$ to indicate whether the voltage level of the control signal node 313 is deemed to be less than 2V above the voltage level of the data line 204'. Trim values indicative of the desired values of Vrefinit0 and Vrefinit1 might be stored to the trim register 128 of FIG. 1. As is known, trim values may be utilized to control an output voltage level of a voltage generation device (not shown), such as a charge pump. For various embodiments, the trim values may be utilized across the entire array of memory cells, or different portions of the array of memory cells, such as different blocks or even different data lines 204', may have different trim values indicative of differing values of Vrefinit0 and/or Vrefinit1, e.g., where characterization of the memory device may indicate different operating characteristics of the corresponding transistors 311, different initial voltage levels, or different capacitance values, etc.

Figure 5:
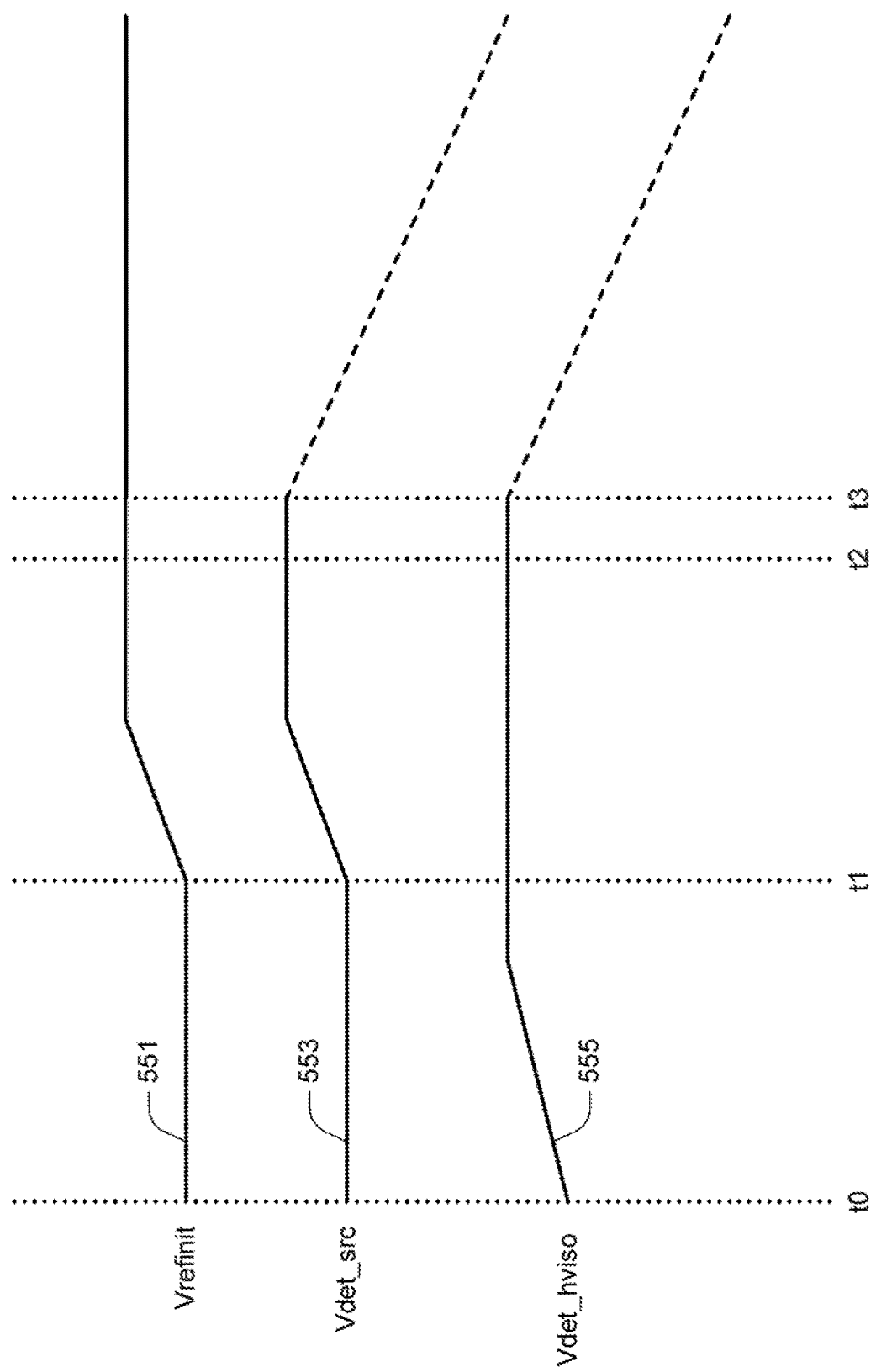
FIG. 5 is a timing diagram for use in describing operation of the circuitry of FIG. 4 in accordance with an embodiment.

FIG. 5 is a timing diagram for use in describing operation of the circuitry of FIG. 4 in accordance with an embodiment. FIG. 5 will first be discussed with reference specifically to the comparator $421_0$, and then its application to the comparator $421_1$ will be discussed. In FIG. 5, the trace 551 may represent a voltage level of the voltage node $447_0$, the trace 553 may represent a voltage level of the voltage node $423_0$, and the trace 555 may represent a voltage level of the voltage node $425_0$. For this example, the transistor $445_0$ may be activated at time t0 of FIG. 5.

Comparators, such as comparator $421_0$, may experience offsets such that their output transitions at some point other than the ideal situation where both inputs are receiving an equal voltage level. Compensation schemes are known, and might include applying a same voltage level to both inputs, and then adding or removing charge from one input until the output of the comparator transitions. With reference to FIG. 5, the period from time t0 to t1 might represent such a compensation scheme. For example, at time t0, Vrefinit may be applied to the voltage node $447_0$, and thus the voltage node $423_0$, at a voltage level equal to the voltage level of Vdet_hviso of the voltage node $425_0$. Charge might then be added to the voltage node $425_0$, for example, to cause the output of the comparator $421_0$ to transition. Adding charge might thus result in an increase of the voltage level of the voltage node $425_0$ as shown. The voltage node $425_0$ might then be allowed to electrically float. For some embodiments, such compensation is not performed.

At time t1, the voltage level applied to the voltage node $447_0$ might be set (e.g., increased) to the determined value of Vrefinit0, resulting in a corresponding increase in the voltage level of the voltage node $423_0$. At time t2, the transistor $445_0$ may be deactivated, thus allowing the voltage node $423_0$ to electrically float. Discharge of the voltage level of the data line 204', and resulting discharge of the voltage level of the control signal node 313 (e.g., the voltage level of the control gate of the transistor 311), might begin at time t3. The comparator $421_0$ may then indicate whether the voltage level of the voltage node $425_0$ is greater than the voltage level of the voltage node $423_0$. In other words, the comparator $421_0$ may provide an indication whether a difference between the voltage level of the control signal node 313 and the voltage level of the data line 204' is deemed to be greater than some value, e.g., some upper limit.

Referring again to FIG. 5, the trace 551 may represent a voltage level of the voltage node $447_1$, the trace 553 may represent a voltage level of the voltage node $423_1$, and the trace 555 may represent a voltage level of the voltage node $425_1$. For this example, the transistor $445_1$ may be activated at time t0 of FIG. 5.

At time t0, Vrefinit may be applied to the voltage node $447_1$, and thus the voltage node $423_1$, at a voltage level equal to the voltage level of Vdet_hviso of the voltage node $425_1$. Charge might then be added to the voltage node $425_1$, for example, to cause the output of the comparator $421_1$ to transition. Adding charge might thus result in an increase of the voltage level of the voltage node $425_1$ as shown. The voltage node $425_1$ might then be allowed to electrically float. For some embodiments, such compensation is not performed.

At time t1, the voltage level applied to the voltage node $447_1$ might be set (e.g., increased) to the determined value of Vrefinit1, resulting in a corresponding increase in the voltage level of the voltage node $423_1$. At time t2, the transistor $445_1$ may be deactivated, thus allowing the voltage node $423_1$ to electrically float. Discharge of the voltage level of the data line 204', and resulting discharge of the voltage level of the control signal node 313 (e.g., the voltage level of the control gate of the transistor 311), might begin at time t3. The comparator $421_1$ may then indicate whether the voltage level of the voltage node $425_0$ is less than the voltage level of the voltage node $423_1$. In other words, the comparator $421_1$ may provide an indication whether a difference between the voltage level of the control signal node 313 and the voltage level of the data line 204' is deemed to be less than some value, e.g., some lower limit.

Figure 6:
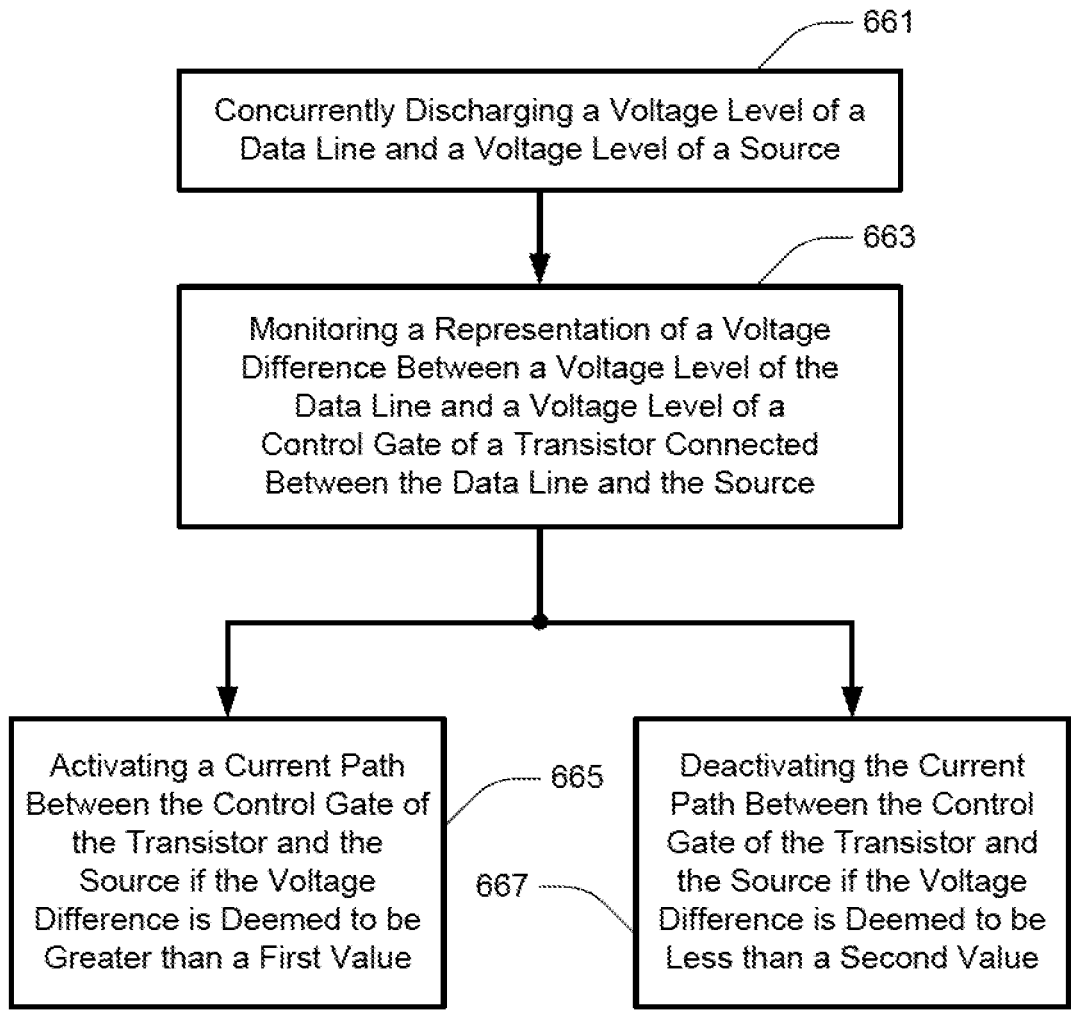
FIG. 6 is a flowchart of a method of operating a memory in accordance with an embodiment.

FIG. 6 is a flowchart of a method of operating a memory in accordance with an embodiment. The method of FIG. 6 might occur during an erase operation, e.g., during the discharge of the erase voltages from the data line 204' and the source 216 following an erase pulse. The method may be performed for each of a number of data lines 204', e.g., each data line of memory cells subjected to the erase voltages, and may be performed concurrently for each of these data lines. This might be true regardless of whether each of those memory cells were selected for erase during the erase operation, e.g., where multiple blocks of memory cells share a common source 216, but may be erased individually.

At 661, a voltage level of a data line and a voltage level of a source are discharged concurrently. Discharge of the voltage level of the data line may include discharging the data line to the source through a transistor connected therebetween, e.g., transistor 311 of FIG. 3. At 663, a representation of a voltage difference between a voltage level of the data line and a voltage level of a control gate of a transistor connected between the data line and the source is monitored, e.g., concurrently with discharging the voltage level of the data line. If the voltage difference is deemed to be greater than a first value, a current path between the control gate of the transistor and the source may be activated at 665. For example, the control gate of the transistor and the source might be electrically connected. If the voltage difference is deemed to be less than a second value, the current path between the control gate of the transistor and the source may be deactivated at 667. For example, the control gate of the transistor and the source might be electrically isolated. The second value may be less than the first value, e.g., the second value may correspond to a voltage difference that is less than a voltage difference corresponding to the first value.

Figure 7:
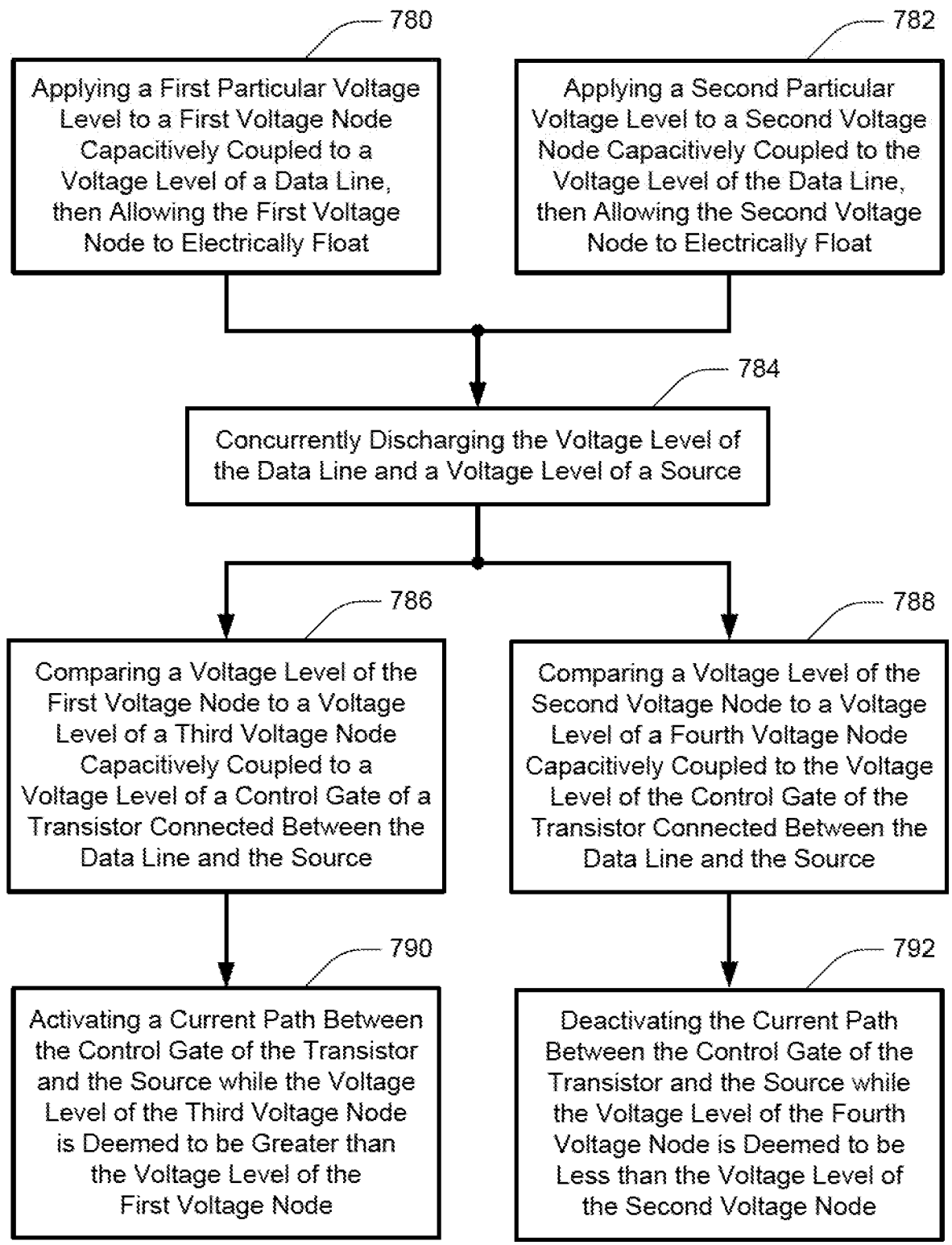
FIG. 7 is a flowchart of a method of operating a memory in accordance with an embodiment.

FIG. 7 is a flowchart of a method of operating a memory in accordance with an embodiment. The method of FIG. 7 might occur during an erase operation, e.g., during the discharge of the erase voltages from the data line 204' and the source 216 following an erase pulse. The method may be performed for each of a number of data lines 204', e.g., each data line of memory cells subjected to the erase voltages, and may be performed concurrently for each of these data lines. This might be true regardless of whether each of those memory cells were selected for erase during the erase operation, e.g., where multiple blocks of memory cells share a common source 216, but may be erased individually.

At 780, a first particular voltage level (e.g., Vrefinit0) is applied to a first voltage node (e.g., voltage node $423_0$) capacitively coupled to a voltage level of a data line (e.g., data line 204'), then the first voltage node is allowed to electrically float (e.g., is electrically floated). At 782, a second particular voltage level (e.g., Vrefinit1) is applied to a second voltage node (e.g., voltage node $423_1$) capacitively coupled to the voltage level of the data line (e.g., data line 204'), then the second voltage node is allowed to electrically float (e.g., is electrically floated). The application of the second particular voltage level at 782 may be performed prior to 780, concurrently with 780 or subsequent to 780.

At 784, e.g., while the first voltage node and the second voltage node are electrically floating, the voltage level of the data line and the voltage level of a source (e.g., source 216) are concurrently discharged.

At 786, e.g., while discharging the voltage level of the data line and the voltage level of the source, a voltage level of the first voltage node is compared to a voltage level of a third voltage node (e.g., voltage node $425_0$) capacitively coupled to a voltage level (e.g., of control signal node 313) of a control gate of a transistor (e.g., transistor 311) connected between the data line and the source. At 788, e.g., while discharging the voltage level of the data line and the voltage level of the source, a voltage level of the second voltage node is compared to a voltage level of a fourth voltage node (e.g., voltage node $425_1$) capacitively coupled to a voltage level (e.g., of control signal node 313) of the control gate of the transistor connected between the data line and the source.

At 790, e.g., while discharging the voltage level of the data line and the voltage level of the source, a current path (e.g., transistor 441) between the source and the control gate of the transistor connected between the data line and the source may be activated while the voltage level of the third voltage node is deemed to be greater than the voltage level of the first voltage node. At 792, e.g., while discharging the voltage level of the data line and the voltage level of the source, the current path between the source and the control gate of the transistor connected between the data line and the source may be deactivated while the voltage level of the fourth voltage node is deemed to be less than the voltage level of the second voltage node.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
a plurality of strings of series-connected memory cells;
a plurality of data lines, wherein each data line of the plurality of data lines is selectively connected to a respective string of series-connected memory cells of the plurality of strings of series-connected memory cells;
a common source selectively connected to each string of series-connected memory cells of the plurality of strings of series-connected memory cells; and
control logic configured to perform an erase operation on the plurality of strings of series-connected memory cells, wherein, during the erase operation, the control logic is further configured to cause the memory to:
apply an erase pulse having a first voltage level to a particular data line of the plurality of data lines and to the common source concurrently with applying a second voltage level, higher than the first voltage level, to a control gate of a transistor connected between the particular data line and the common source;
after applying the erase pulse, concurrently discharge the voltage level of the particular data line and the voltage level of the common source;
monitor a representation of a voltage difference between the voltage level of the particular data line and the voltage level of the control gate of the transistor;
activate a current path between the control gate of the transistor and the common source in response to the voltage difference being deemed to be greater than a first value that is less than a breakdown voltage of the transistor; and
deactivate the current path between the control gate of the transistor and the common source in response to the voltage difference being deemed to be less than a second value that is greater than a threshold voltage of the transistor.

2. The memory of claim 1, wherein, during the concurrent discharge of the voltage level of the particular data line and the voltage level of the common source, the control logic is configured to cause the memory to electrically float the control gate of the transistor when the current path is deactivated.

3. The memory of claim 1, wherein the transistor is a particular transistor of a plurality of transistors, wherein each transistor of the plurality of transistors is connected between a respective data line of the plurality of data lines and the common source, and wherein, for each data line of the plurality of data lines, the control logic is configured to cause the memory to:
apply the erase pulse to that data line of the plurality of data lines concurrently with applying the erase pulse to the common source and concurrently with applying the second voltage level to a control gate of the respective transistor for that data line;
after applying the erase pulse to that data line, concurrently discharge the voltage level of that data line and the voltage level of the common source;
monitor a representation of a respective voltage difference between the voltage level of that data line and the voltage level of the control gate of the respective transistor for that data line;
activate a current path between the control gate of the respective transistor for that data line and the common source in response to the respective voltage difference for that data line being deemed to be greater than the first value; and
deactivate the current path between the control gate of the respective transistor for that data line and the common source in response to the respective voltage difference for that data line being deemed to be less than the second value.

4. The memory of claim 1, wherein the control logic is further configured to:
  after activating the current path in response to the voltage difference being deemed to be greater than the first value, maintain activation of the current path until the voltage difference is deemed to be less than the second value; and
  after deactivating the current path in response to the voltage difference being deemed to be less than the second value, maintain deactivation of the current path until the voltage difference is deemed to be greater than the first value.

5. A memory, comprising:
  a plurality of strings of series-connected memory cells;
  a plurality of data lines, wherein each data line of the plurality of data lines is selectively connected to a respective string of series-connected memory cells of the plurality of strings of series-connected memory cells;
  a common source selectively connected to the plurality of strings of series-connected memory cells; and
  control logic configured to perform an erase operation on the plurality of strings of series-connected memory cells, wherein, during the erase operation, the control logic is further configured to cause the memory to:
    apply a first particular voltage level to a first voltage node capacitively coupled to a voltage level of a particular data line of the plurality of data lines, then allow the first voltage node to electrically float;
    apply a second particular voltage level to a second voltage node capacitively coupled to the voltage level of the particular data line, then allow the second voltage node to electrically float;
    concurrently discharge the voltage level of the particular data line and a voltage level of a common source while the particular data line is connected to the common source through a transistor;
    compare a voltage level of the first voltage node to a voltage level of a third voltage node capacitively coupled to a voltage level of a control gate of the transistor;
    compare a voltage level of the second voltage node to a voltage level of a fourth voltage node capacitively coupled to the voltage level of the control gate of the transistor;
    activate a current path between the control gate of the transistor and the common source while the voltage level of the third voltage node is deemed to be greater than the voltage level of the first voltage node; and
    deactivate the current path between the control gate of the transistor and the common source while the voltage level of the fourth voltage node is deemed to be less than the voltage level of the second voltage node.

6. The memory of claim 5, further comprising:
  a first capacitance connected between the particular data line and the first voltage node for capacitively coupling the first voltage node to the voltage level of the particular data line;
  a second capacitance connected between the control gate of the transistor and the third voltage node for capacitively coupling the third voltage node to the voltage level of the control gate of the transistor;
  a third capacitance connected between the particular data line and the second voltage node for capacitively coupling the second voltage node to the voltage level of the particular data line; and
  a fourth capacitance connected between the control gate of the transistor and the fourth voltage node for capacitively coupling the fourth voltage node to the voltage level of the control gate of the transistor;
  wherein the first capacitance, the second capacitance, the third capacitance and the fourth capacitance have substantially equal sizing.

7. The memory of claim 6, further comprising:
  a fifth capacitance connected between first voltage node and a first reference node;
  a sixth capacitance connected between third voltage node and a second reference node;
  a seventh capacitance connected between second voltage node and a third reference node; and
  an eighth capacitance connected between fourth voltage node and a fourth reference node;
  wherein the fifth capacitance, the sixth capacitance, the seventh capacitance and the eighth capacitance have substantially equal sizing.

8. The memory of claim 7, wherein the first reference node, the second reference node, the third reference node and the fourth reference node are a same reference node.

9. The memory of claim 5, wherein the first particular voltage level is selected such that the control logic being configured to activate the current path between the control gate of the transistor and the common source while the voltage level of the third voltage node is deemed to be greater than the voltage level of the first voltage node comprises the control logic being configured to cause the memory to activate the current path between the control gate of the transistor and the common source before the voltage level of the control gate of the transistor is deemed to be equal to a breakdown voltage level of the transistor, and wherein the second particular voltage level is selected such that the control logic being configured to cause the memory to deactivate the current path between the control gate of the transistor and the common source while the voltage level of the fourth voltage node is deemed to be less than the voltage level of the second voltage node comprises the control logic being configured to cause the memory to deactivate the current path between the control gate of the transistor and the common source before the voltage level of the control gate of the transistor is deemed to be equal to a threshold voltage level of the transistor.

10. The memory of claim 5, wherein the control logic being configured to cause the memory to discharge the voltage level of the particular data line comprises the control logic being configured to cause the memory to discharge the voltage level of the particular data line to the common source through the transistor.

11. The memory of claim 5, wherein the control logic is further configured to cause the memory to:
  electrically float the third voltage node while comparing the voltage level of the first voltage node to the voltage level of the third voltage node; and
  electrically float the fourth voltage node while comparing the voltage level of the second voltage node to the voltage level of the fourth voltage node.

12. The memory of claim 11, wherein the control logic is further configured to cause the memory to:
  adjust a level of charge on the third voltage node prior to electrically floating the third voltage node; and
  adjust a level of charge on the fourth voltage node prior to electrically floating the fourth voltage node.

13. The memory of claim 5, wherein the transistor is a first transistor, wherein the control logic being configured to cause the memory to activate the current path comprises the control logic being configured to cause the memory to activate a second transistor connected between the control gate of the first transistor and the common source, and wherein the control logic being configured to cause the memory to deactivate the current path comprises the control logic being configured to cause the memory to deactivate the second transistor.

14. A memory, comprising:
a plurality of strings of series-connected memory cells;
a plurality of data lines, wherein each data line of the plurality of data lines is selectively connected to a respective string of series-connected memory cells of the plurality of strings of series-connected memory cells;
a common source selectively connected to the plurality of strings of series-connected memory cells;
a plurality of first transistors, wherein each first transistor of the plurality of first transistors is connected between a respective data line of the plurality of data lines and the common source;
a plurality of second transistors, wherein each second transistor of the plurality of second transistors is connected between a control gate of a respective first transistor of the plurality of first transistors and the common source; and
control logic configured to perform an erase operation on the plurality of strings of series-connected memory cells, wherein, during the erase operation, the control logic is further configured to cause the memory to:
apply an erase pulse having a first voltage level to each data line of the plurality of data lines and to the common source concurrently with applying a second voltage level, higher than the first voltage level, to the control gate of each first transistor of the plurality of first transistors;
after applying the erase pulse, concurrently discharge the voltage level of each data line of the plurality of data lines and the voltage level of the common source; and
for each data line of the plurality of data lines:
monitor a representation of a respective voltage difference between the voltage level of that data line and the voltage level of the control gate of the respective first transistor for that data line;
activate the respective second transistor for the respective first transistor for that data line in response to the respective voltage difference for that data line being deemed to be greater than a first value that is less than a breakdown voltage of the respective first transistor for that data line, and greater than a threshold voltage of the respective first transistor for that data line; and
deactivate the respective second transistor for the respective first transistor for that data line in response to the respective voltage difference for that data line being deemed to be less than a second value that is greater than the threshold voltage of the respective first transistor for that data line, and less than the breakdown voltage of the respective first transistor for that data line.

15. The memory of claim 14, further comprising:
a plurality of diode-connected third transistors, wherein each diode-connected third transistor of the plurality of diode-connected third transistors is connected between a respective second transistor of the plurality of second transistors and its respective data line of the plurality of data lines.

16. The memory of claim 14, further comprising:
a first comparator; and
a second comparator;
wherein control logic being configured to monitor the representation of the respective voltage difference between the voltage level of a particular data line of the plurality of data lines and the voltage level of the control gate of the respective first transistor for the particular data line comprises the control logic being configured to:
monitor an output of the first comparator having a first input capacitively coupled to the particular data line and a second input capacitively coupled to the control gate of the respective first transistor for the particular data line, wherein the output of the first comparator is configured to indicate whether the respective voltage difference for the particular data line is deemed to be greater than the first value; and
monitor an output of the second comparator having a first input capacitively coupled to the control gate of the respective first transistor for the particular data line and a second input capacitively coupled to the particular data line, wherein the output of the second comparator is configured to indicate whether the respective voltage difference for the particular data line is deemed to be less than the second value.

17. The memory of claim 16, wherein the first input of the first comparator is further capacitively coupled to a first reference node, wherein the second input of the first comparator is further capacitively coupled to a second reference node, wherein the first input of the second comparator is further capacitively coupled to a third reference node, and wherein the second input of the second comparator is further capacitively coupled to a fourth reference node.

18. The memory of claim 17, wherein the first reference node, the second reference node, the third reference node, and the fourth reference node are a same reference node.

19. The memory of claim 17, wherein the first reference node, the second reference node, the third reference node, and the fourth reference node are each configured to receive a reference potential.

20. The memory of claim 19, wherein the reference potential is selected from a group consisting of a ground potential and 0V.

* * * * *